(12) United States Patent
Park et al.

(10) Patent No.: US 7,211,826 B2
(45) Date of Patent: May 1, 2007

(54) ORGANIC ELECTROLUMINESCENT DISPLAY

(75) Inventors: Sang-Il Park, Seoul (KR); Tae-Wook Kang, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/927,193

(22) Filed: Aug. 27, 2004

(65) Prior Publication Data

US 2005/0045882 A1 Mar. 3, 2005

(30) Foreign Application Priority Data

Aug. 28, 2003 (KR) ...................... 10-2003-0060016

(51) Int. Cl.
*H01L 29/04* (2006.01)
*H01L 29/15* (2006.01)
*H01L 31/036* (2006.01)

(52) U.S. Cl. .................... 257/72; 257/40; 257/59; 257/E21.413

(58) Field of Classification Search ................ 257/72, 257/59, 149, 151, 40, 89, E21.535, E21.413, 257/E51.04
See application file for complete search history.

(56) References Cited

U.S. PATENT DOCUMENTS

| | | | | |
|---|---|---|---|---|
| 5,414,547 | A * | 5/1995 | Matsuo et al. ................. | 349/44 |
| 6,359,606 | B1 * | 3/2002 | Yudasaka ...................... | 345/87 |
| 6,744,197 | B2 * | 6/2004 | Park et al. .................... | 313/504 |
| 6,833,666 | B2 * | 12/2004 | Seo et al. ..................... | 313/498 |
| 6,862,008 | B2 * | 3/2005 | Yamazaki et al. ............. | 345/62 |
| 6,888,304 | B2 * | 5/2005 | Sato ............................. | 313/498 |
| 2004/0004432 | A1 * | 1/2004 | Park et al. .................... | 313/504 |
| 2004/0183083 | A1 * | 9/2004 | Koo .............................. | 257/88 |
| 2005/0023964 | A1 * | 2/2005 | Omura et al. ................. | 313/504 |
| 2005/0082968 | A1 * | 4/2005 | Choi et al. .................... | 313/506 |
| 2005/0104814 | A1 * | 5/2005 | Choi et al. .................... | 345/76 |
| 2005/0140290 | A1 * | 6/2005 | Park et al. .................... | 313/512 |

FOREIGN PATENT DOCUMENTS

| | | |
|---|---|---|
| JP | 05-226475 A1 | 9/1993 |
| JP | 07-153756 A1 | 6/1995 |
| JP | 2001-345179 A1 | 12/2001 |
| JP | 2002-289857 A1 | 10/2002 |
| KR | 2001-0029824 | 4/2001 |

* cited by examiner

*Primary Examiner*—B. William Baumeister
*Assistant Examiner*—Igwe U. Anya
(74) *Attorney, Agent, or Firm*—H.C. Park & Associates, PLC

(57) ABSTRACT

An organic electroluminescent display includes a substrate having an array portion with pixels, and a pad portion coupled to an external power supply. A semiconductor structure is formed on the substrate with a source electrode, a drain electrode and a pad. A passivation layer is formed on the semiconductor structure with via holes exposing regions of the source and the drain electrodes at the array portion and the pad at the pad portion. Portions of the passivation layer contacting the via holes between the array portion and the pad portion have the same thickness. A conductive layer fills the via holes. A pixel defining layer is formed over the entire surface of a flattening layer and the conductive layer with pixel regions exposing regions of the conductive layer at the array portion. An organic electroluminescent film is formed at each pixel region.

20 Claims, 2 Drawing Sheets

ORGANIC ELECTROLUMINESCENT DISPLAY

This application claims the benefit of Korean Patent Application No. 2003-0060016, filed on Aug. 28, 2003, which is hereby incorporated by reference for all purposes as if fully set forth herein.

BACKGROUND OF THE INVENTION

1. Field of the Invention

The present invention relates to an organic electroluminescent display, and in particular, to an organic electroluminescent display that prevents pad electrodes from being over-etched by removing the thickness difference of a passivation layer including via holes between an array portion and a pad portion.

2. Description of Related Art

Generally, an electroluminescent (EL) display is a display device that utilizes the principle that electrons from a cathode and holes from an anode are injected into a light emission layer while being combined to form excitons, and the light emission layer emits light when the excitons go down from the excited state to the ground state.

In contrast to a conventional thin film transistor liquid crystal display, an organic EL display does not need a separate light source and uses a lightweight structure having a reduced volume. In an organic EL display, organic material films, which emit light under the application of electric current, are arranged at respective pixels in a matrix form, and the amount of electric current applied to the organic material films is varied to display desired images. The organic EL display has numerous advantages, such as low-driving voltage, lightweight, flatness, wide viewing angle, and fast response time. Furthermore, organic EL displays are expected to be a next-generation display device.

The organic EL display includes a plurality of pixels arranged in a matrix form, and many thin film patterns formed at each pixel region, such as a thin film transistor for a switching and driving element, a pixel electrode, and an organic EL film.

Referring to the drawings, FIG. 1 is a cross-sectional view of an organic EL display 15 configured in accordance with the prior art. As shown in FIG. 1, the organic EL display 15 has a panel with an array portion A for forming pixels, and a circuit pad portion P placed at the periphery thereof to be connected to an external power supply (not shown). A blocking layer 2 made of $SiO_2$ is formed on an insulating substrate layer 1, and a polycrystalline silicon layer 3 is formed on the blocking layer 2 having a predetermined width.

Source and drain regions 3c and 3a, respectively, doped with a high concentration of impurities are formed at the polycrystalline silicon layer 3, and a channel region 3b is formed between the source region 3c and the drain region 3a.

A gate insulating layer 4 of $SiO_2$ or $Si_3N_4$ is formed over the entire surfaces of the blocking layer 2 and the polycrystalline silicon layer 3. Gate electrodes 5a and 5b made of Al are formed on the gate insulating layer 4 having a predetermined width, and an inter-layered insulating layer 6 is formed on the gate insulating layer 4 and the gate electrodes 5a and 5b.

Source electrode 7a and drain electrode 7b, respectively, made of Al are formed on the inter-layered insulating layer 6 so that the source electrode 7a and the drain electrode 7b are connected to the source region 3c and the drain region 3a, respectively. First and second insulating passivation layers 8 and 9, respectively, are formed on the source electrode 7a and the drain electrode 7b, forming a flat top surface thereof.

The first and second insulating passivation layers 8 and 9, respectively, are selectively etched such that they expose the source electrode 7a and the drain electrode 7b. A conductive layer 10 fills the etched portion of the first insulating passivation layer 8 and the second insulating passivation layer 9 and a pixel defining layer 11 is formed on the conductive layer 10. The pixel defining layer 11 is selectively etched to form pixel regions 12.

During the process of forming the first insulating and second insulating passivation layers 8, 9, the first insulating passivation layer 8 having a thin thickness is first formed, and the second insulating passivation layer 9 having a thick thickness is then formed thereon having a flat top surface to make a uniform topology. The first insulating passivation layer 8 exhibits the topology of the underlying structure as it is formed on that structure with a uniform thickness, similar to the insulating substrate layer 1. The second insulating passivation layer 9 removes the surface stepped differences in the underlying structure and forms a flat top surface over the entire area of the wafer.

The first and second insulating passivation layers 8, 9 must have a flat top surface over the entire area of the insulating substrate 1 in order to conduct a photolithography process for forming via holes 20 subsequently. The via holes 20 exposing the source and drain electrodes 7a and 7b, respectively, are formed after the formation of the first and second insulating passivation layers 8, 9. By means of the via holes 20, metallic element or conductive layer 10 at the array portion A is connected to the underlying drain electrode 7b, while the pad electrode 19 at the pad portion P is connected to the underlying pad 7c.

However, the first and second insulating passivation layers 8, 9 have different thickness depending upon the surface step differences of the underlying structure. More specifically, the source and drain electrodes 7a, 7b alone, or the source and drain electrodes 7a, 7b plus the gate electrode 5b, or the source and drain electrodes 7a, 7b plus the gate electrodes 5a, 5b plus the polycrystalline silicon layer 3 may be under the first and second insulating passivation layers 8,9.

The difference in thicknesses of the first and second insulating passivation layers 8, 9 is formed between the array portion A and the pad portion P. Due to the thickness difference of the first and second insulating passivation layers 8, 9, the etching depth for forming the via holes 20 is different between the array portion A and the pad portion P.

As shown in FIG. 1, the thickness of the second insulating passivation layer 9 to be etched at the pad portion P is indicated by T1, and the thickness of the second insulating passivation layer 9 to be etched at the array portion A is indicated by T2. T1 is clearly shown as being smaller than T2. Except for the first insulating passivation layer 8 which has a uniform thickness, the etching depth for forming the via holes 20 is different between the array portion A and the pad portion P by the value of T2 subtracted by T1.

As the difference in the etching depth for forming the via holes 20 becomes greater, the thicker portions of the first and second insulating passivation layers 8,9 at the array portion A are etched until the underlying source and drain electrodes 7a, 7b are exposed, while the thinner portions of the first and second insulating passivation layers 8,9 at the pad portion P, as well as the underlying pad 7c, are etched continuously. This results in over-etching of the pad 7c.

The over-etching of the pad 7c at the pad portion P becomes more severe when the difference in the etching depth of the first and second insulating passivation layers 8, 9 for forming the via holes is 3000Å or more. Then electrode over-etching causes contact failures.

Accordingly, there is a need to prevent pad electrodes from being over-etched during the via hole formation process due to differences in thickness of the passivation layer.

SUMMARY OF THE INVENTION

One of the aspects of the present invention is to prevent the source electrode and the drain electrode from being over-etched.

The present invention enables to reduce the thickness difference of the passivation layer between the array portion and the pad portion.

An organic EL display has a dummy gate pattern formed under the source electrode and the drain electrode at the array portion to reduce the thickness of the flattening layer at the array portion to the same level as that at the pad portion. Alternatively, the gate electrode at the pad portion may be omitted to increase the thickness of the flattening layer at the pad portion to the same level as that at the array portion.

According to one aspect of the present invention, the organic EL display includes a substrate having an array portion with pixels, and a pad portion connected to an external power supply. A semiconductor structure is formed on the substrate with source and drain electrodes. An insulating passivation layer is formed on the semiconductor structure having via holes exposing predetermined regions of the source and the drain electrodes at the array portion and the pad portion. The portions of the passivation layer in contact with the via holes between the array portion and the pad portion have the same thickness. A conductive layer fills the via holes. A pixel defining layer is formed over the entire surface of the flattening layer, and the conductive layer having pixel regions exposing predetermined regions of the conductive layer at the array portion. An organic EL film is formed at each pixel region.

According to another aspect of the present invention, the organic EL display includes a substrate having an array portion with pixels, and a pad portion connected to an external power supply. A semiconductor structure is formed on the substrate, and source and drain electrodes are formed on the semiconductor structure. Top surfaces of the source and drain electrodes in the array portion and the top surface of the pads in the pad portion are located on the same plane. The insulating passivation layer is formed on the semiconductor structure. Via holes exposing predetermined regions of the source and the drain electrodes and the pads are formed at the array portion and the pad portion. A conductive layer fills the via holes. A pixel defining layer is formed over the entire surface of the flattening layer. The conductive layer, having pixel regions exposing predetermined regions of the conductive layer, is formed at the array portion. An organic EL film is formed at each pixel region.

Located in the array portion under the via holes are the substrate, a gate insulating layer, gate electrodes, an inter-layer insulating layer, and the source and drain electrodes, deposited in that order; while under the via holes at the pad portion are the substrate, the gate insulating layer, a dummy gate pattern, the inter-layer insulating layer, and the pads, deposited in that order. The dummy gate pattern and the gate electrodes are simultaneously formed with the same material while bearing the same thickness.

Under the via holes at the array portion, the substrate, a gate insulating layer, an inter-layer insulating layer, and the source and drain electrodes, are deposited in that order; while under the via holes at the pad portion the substrate, the gate insulating layer, the inter-layer insulating layer, and the pads are deposited in that order.

The insulating passivation layer has a first insulating layer reflecting the topology of the underlying structure with a uniform thickness, and a second insulating layer formed on the first insulating layer with a flat top surface.

A lower source and a lower drain are connected to the source and the drain electrodes at the array portion, respectively.

The lower source and the lower drain are formed by doping impurities at the peripheries of the polycrystalline silicon layer, and the portion of the polycrystalline silicon layer located between the lower source and the lower drain functions as a channel region. The gate electrodes and the source and drain electrodes are formed of a metallic material.

The substrate is formed with an insulating material, and a blocking layer is formed at the interface between the substrate and the polycrystalline silicon layer, and at the interface between the substrate and the gate insulating layer.

DETAILED DESCRIPTION OF THE INVENTION

Figure 2:
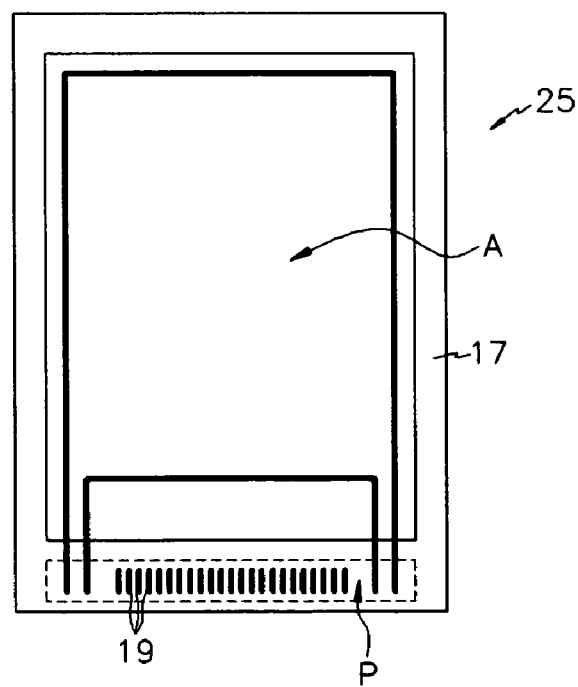
FIG. 2 is a plan view of an array portion and a pad portion of an organic EL display configured according to one exemplary embodiment of the present invention.
Figure 3:
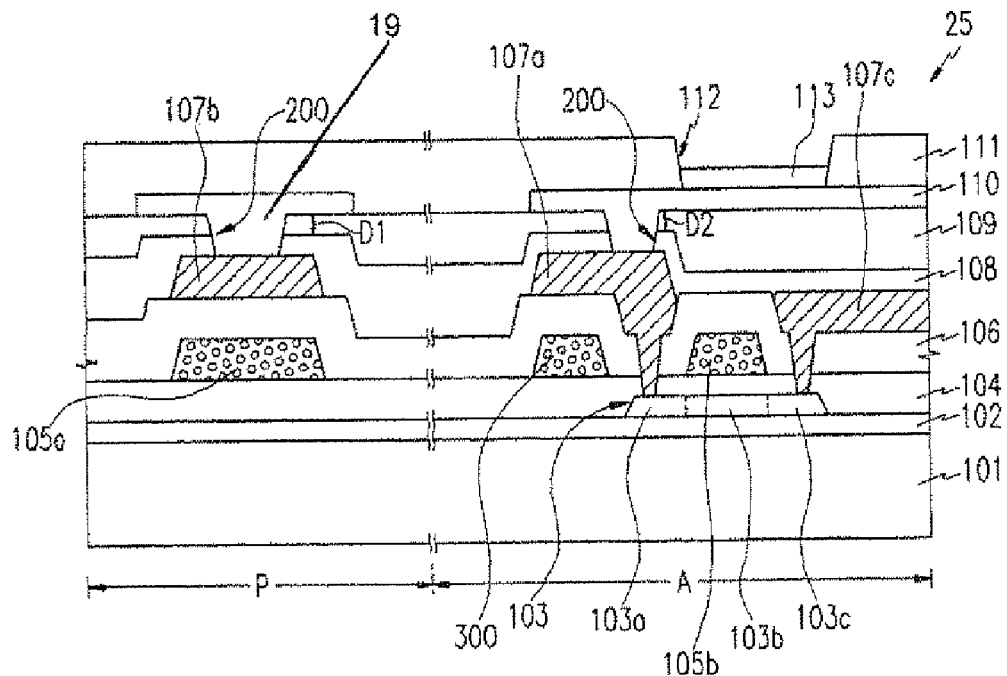
FIG. 3 is a cross-sectional view of an organic EL display configured according to the exemplary embodiment of the present invention.

FIGS. 2 and 3 illustrate an organic EL display 25 configured in accordance with one exemplary embodiment of the present invention. The EL display 25 has a panel 17 with an array portion A for forming pixels, and a pad portion P located at the periphery thereof. Pads 19 are formed at the pad portion P to apply driving electrical signals to power transmission lines, scanning lines and data lines.

As shown in FIG. 3, the organic EL display 25 has a blocking layer 102 formed of $SiO_2$ on an insulating substrate 101, and a polycrystalline silicon layer 103 having a predetermined width formed on the blocking layer 102.

N-type or p-type impurity ions are doped at the peripheries of the polycrystalline silicon layer 103 at a high concentration to form a lower drain region 103a and a lower source region 103c. The region between the lower drain region 103a and the lower source region 103c becomes a channel region 103b where electrons or holes migrate.

A gate insulating layer 104 of $SiO_2$ or $Si_3N_4$ is formed over the entire surface of the blocking layer 102 and the polycrystalline layer 103. A portion of the gate insulating layer 104 located on the polycrystalline silicon layer 103 is higher than the other portions thereof. Since the polycrystalline silicon layer 103 is relatively thin, the step difference between the blocking layer 102 and the polycrystalline silicon layer 103 is so small that the effect is insignificant.

Therefore, for ease of explanation, such step difference is omitted and not illustrated in FIG. 3.

Gate electrodes 105a and 105b and a dummy gate pattern 300 made of Al are formed on the gate insulating layer 104 having a predetermined width. An inter-layered insulating layer 106 is formed on the gate insulating layer 104, the gate electrodes 105a and 105b, and the dummy gate pattern 300.

It is preferable that the dummy gate pattern 300 and the gate electrodes 105a and 105b are simultaneously formed through the same deposition and photolithography process. Accordingly, the dummy gate pattern 300 and the gate electrodes 105a and 105b are to be formed of the same material while having the same thickness.

The dummy gate pattern 300 is located under the drain electrode 107a to be formed with a via hole 200 later, and this is intentionally formed to reduce the thickness of the flattening layer 109 contacting the via hole 200 formed at the array portion A. The etching depth for forming the via hole 200 is the same level as that at the pad portion P. The shape of the dummy gate pattern 300 is not limited to a particular one, but may be modified with any permissible variation.

The gate electrodes 105a, formed at the pad portion P, lower the contact resistance of the pad 107b, which also corresponds to pad electrode 19 of FIG. 2 and could be electrically coupled to the external power supply through the via holes 200.

The inter-layer insulating layer 106 directly reflects the topology of the underlying structure. That is, the portion of the inter-layer insulating layer 106 over the dummy gate pattern 300 and the gate electrodes 105a and 105b is located on a plane higher than the other portions thereof.

The source electrode 107c and the drain electrode 107a and the pad 107b are made of Al and formed on the inter-layered insulating layer 106 having a predetermined width. The source electrode 107c and the drain electrodes 107a at the array portion A are connected to the lower source region 103c and the lower drain region 103a of the polycrystalline silicon layer 103 respectively.

First and second insulating passivation layers 108 and 109 are formed over the entire surface of the inter-layered insulating layer 106 as well as the source and drain electrodes 107a and 107c and the pad 107b to flatten the top surface 109 thereof.

In order to make the first and second insulating passivation layers 108, 109, a first insulating passivation layer 108 is formed having a uniform thickness such that it directly reflects the topology of the underlying structure, and a second insulating passivation layer 109 is formed thereon with a flat top surface. The first and second insulating passivation layers 108 and 109, respectively, have a flat top surface over the entire area of a wafer in order to conduct the subsequent patterning process for forming via holes 200.

The first and second insulating passivation layers 108 and 109, respectively, have via holes 200 selectively etched while exposing the drain electrodes 107a and the pad 107b, respectively, at a predetermined degree, and a conductive layer 110 fills the via holes 200 while being placed thereon.

The via holes 200 at the array portion A connect the pixel electrode 110 to the underlying metallic element drain electrode 107a and those at the pad portion P connect the pad electrodes 19 to the underlying metallic element or pad 107b.

The first and second insulating passivation layers 108,109 containing the via holes 200 placed at the array portion A have the same thickness as those at the pad portion P. Hence, the etching depths of the first and second insulating passivation layers 108,109 for forming the via holes 200 at both array portion A and pad portion P are the same.

Figure 1:
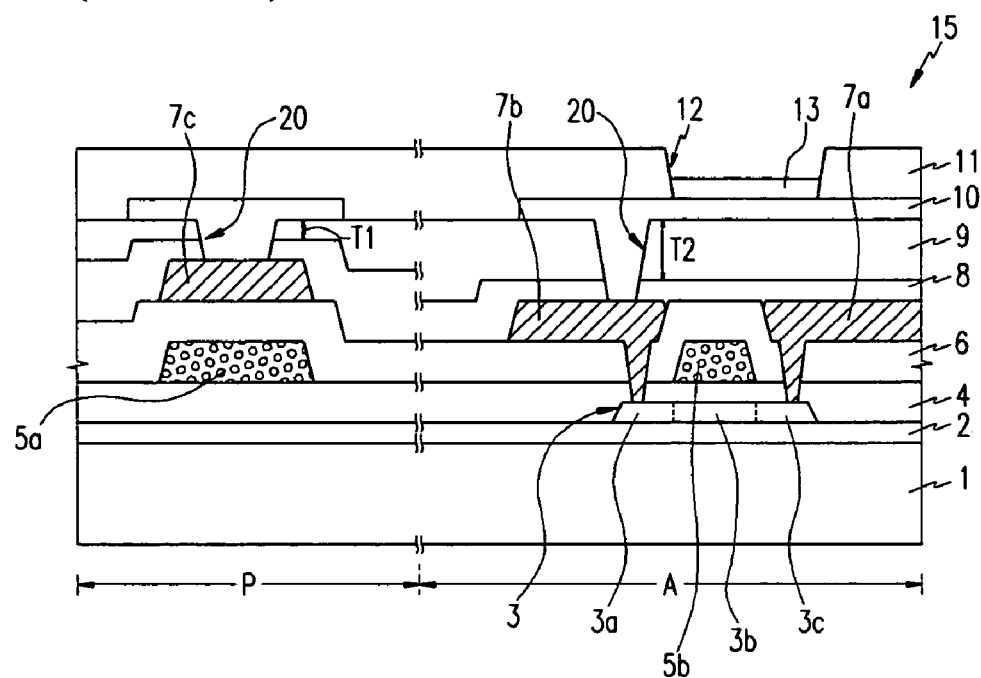
FIG. 1 is a cross-sectional view of a conventional organic EL display.

Compared to the conventional design shown in FIG. 1 where T1 and T2 are different, the etching depth D1 at the pad portion P and the etching depth D2 at the array portion A, which exclude the uniform thickness of the first insulating passivation layer 108 but include only the thickness of the second insulating passivation layer 109, are the same. The thickness of the insulating passivation layer contacting the via hole 200 at the pad portion P is the same as that at the array portion A.

Accordingly, when the first and second insulating passivation layers 108,109 are etched to form via holes 200, the drain electrodes 107a at the array portion A and the pad 107b at the pad portion P are simultaneously exposed. Accordingly, the pad 107b at the pad portion P are protected from over-etching.

A pixel defining layer 111 is formed on the conductive layer 110 and the flattening layer 109, and selectively etched to form pixel regions 112. An organic El film 113 is formed at each pixel region 112.

Figure 4:
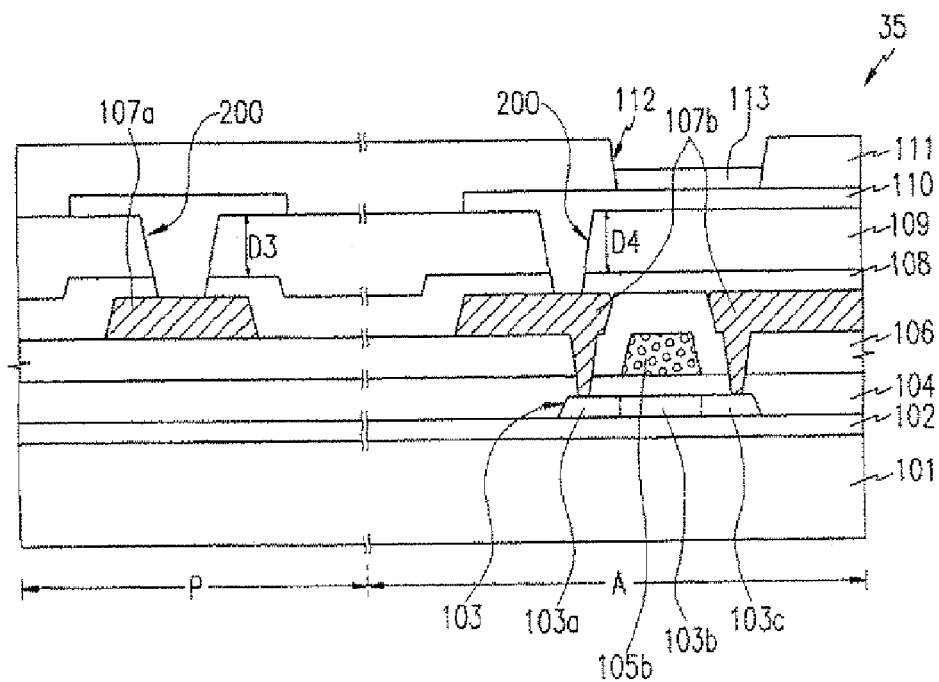
FIG. 4 is a cross-sectional view of an organic EL display configured according to another exemplary embodiment of the present invention.

FIG. 4 illustrates an organic EL display 35 configured according to another embodiment of the present invention. Compared to the EL display 25 shown in FIG. 3 where a dummy gate pattern 300 is formed at the array portion A, the EL display 35 configured according to the another embodiment of the present invention does not have the gate electrodes 105a previously shown in FIG. 3 at the pad portion P.

In the EL display 35, the gate electrodes 105a of FIG. 3 at the pad portion P are omitted while reducing the surface step so that the thickness difference of the first and second insulating passivation layers 108, 109 contacting the via holes 200 between the pad portion P and the array portion A is removed.

Consequently, the etching depth D3 at the pad portion P and the etching depth D4 at the array portion A, which exclude the thickness of the first insulating layer 108 but include only that of the second insulating layer 109, are the same. Compared to the case according to the first embodiment, D3 is greater than D1.

As described above, a dummy gate pattern is formed at the array portion, or the gate electrodes at the pad portion are omitted to remove the thickness difference of the passivation layer between the array portion and the pad portion, thereby protecting the source and drain electrodes or the pad from over-etching.

Although preferred embodiments of the present invention have been described in detail hereinabove, it should be clearly understood that many variations and/or modifications of the basic inventive concept herein taught which may appear to those skilled in the art will still fall within the spirit and scope of the present invention, as defined in the appended claims.

What is claimed is:

1. An organic electroluminescent display, comprising:
    a substrate having an array portion with pixels, and a pad portion with a pad;
    a semiconductor structure formed on the substrate with a source electrode and a drain electrode;
    a passivation layer formed on the semiconductor structure with via holes exposing a region of either the source electrode or the drain electrode at the array portion and the pad at the pad portion, wherein portions of the passivation layer containing the via holes at the array portion and the pad portion have the same thickness;
    a conductive layer filling the via holes;

a pixel defining layer formed on the passivation layer and the conductive layer with pixel regions exposing regions of the conductive layer at the array portion; and an organic electroluminescent film formed at each pixel region.

2. The organic electroluminescent display of claim 1, wherein the semiconductor structure on the substrate at the pad portion includes a gate insulating layer, gate electrodes, an inter-layer insulating layer and the pad that are sequentially deposited over the substrate, while the semiconductor structure on the substrate at the array portion includes the gate insulating layer over the substrate, a dummy gate pattern, the inter-layer insulating layer and the source electrode and the drain electrode that are sequentially deposited over the substrate.

3. The organic electroluminescent display of claim 2, wherein the dummy gate pattern is formed under the via holes at the array portion.

4. The organic electroluminescent display of claim 2, wherein the dummy gate pattern and the gate electrodes are simultaneously formed of the same material while bearing the same thickness.

5. The organic electroluminescent display of claim 1, wherein the semiconductor structure on the substrate at the array portion includes a gate insulating layer, gate electrodes, an inter-layer insulating layer and the source and drain electrodes which are sequentially deposited over the substrate.

6. The organic electroluminescent display of claim 1, wherein the passivation layer has a first insulating layer reflecting the topology of the underlying structure with a uniform thickness, and a second insulating layer formed on the first insulating layer with a flat top surface.

7. The organic electroluminescent display of claim 1, wherein a source region and a drain region are connected to the source electrode and the drain electrode at the array portion, respectively.

8. The organic electroluminescent display of claim 7, wherein the source region and the drain region are formed by doping impurities at peripheries of a polycrystalline silicon layer, and a portion of the polycrystalline silicon layer placed between the source region and the drain region functions as a channel region.

9. The organic electroluminescent display of claim 8, wherein the substrate is an insulating material, and a blocking layer is formed between the substrate and the polycrystalline silicon layer, and between the substrate and the gate insulating layer.

10. The organic electroluminescent display of claim 1, wherein the gate electrode, the source electrode and the drain electrode are formed with a metallic material.

11. An organic electroluminescent display, comprising:
a substrate having an array portion with pixels, and a pad portion with a pad to be connected to an external power supply;
a semiconductor structure formed on the substrate;
a source electrode and a drain electrode formed on the semiconductor structure, wherein top surfaces of the drain electrode at the array portion and the pad at the pad portion are located within the same approximate plane;

a passivation layer formed on the semiconductor structure with via holes exposing regions of the drain electrodes at the array portion and the pad at the pad portion;

a conductive layer filling the via holes;

a pixel defining layer formed on the passivation layer and the conductive layer with pixel regions exposing regions of the conductive layer at the array portion; and an organic electroluminescent film formed at each pixel region.

12. The organic electroluminescent display of claim 11, wherein the semiconductor structure on the substrate at the pad portion includes a gate insulating layer, gate electrodes, an inter-layer insulating layer and the pad that are sequentially deposited over the substrate, and wherein the semiconductor structure on the substrate at the array portion includes the gate insulating layer over the substrate, a dummy gate pattern, the inter-layer insulating layer and the source electrode and the drain electrodes that are sequentially deposited over the substrate.

13. The organic electroluminescent display of claim 12, wherein the dummy gate pattern is formed under the via holes at the array portion.

14. The organic electroluminescent display of claim 12, wherein the dummy gate pattern and the gate electrodes are simultaneously formed of the same material while bearing the same thickness.

15. The organic electroluminescent display of claim 11, wherein the semiconductor structure on the substrate at the pad portion includes a gate insulating layer, gate electrodes, an inter-layer insulating layer and the pad that are sequentially deposited over the substrate.

16. The organic electroluminescent display of claim 11, wherein the passivation layer comprises a first insulating layer reflecting topology of an underlying structure with a uniform thickness, and a second insulating layer formed on the first insulating layer with a flat top surface.

17. The organic electroluminescent display of claim 11, wherein a source region and a drain region are connected to the source electrode and the drain electrode at the array portion, respectively.

18. The organic electroluminescent display of claim 17, wherein the source region and the drain region are formed by doping impurities at sided peripheries of polycrystalline silicon layer, and the portion of the polycrystalline silicon layer placed between the source region and the drain region functions as a channel region.

19. The organic electroluminescent display of claim 18, wherein the substrate is an insulating material, and a blocking layer is formed between the substrate and the polycrystalline silicon layer, and between the substrate and the gate insulating layer.

20. The organic electroluminescent display of claim 11, wherein the gate electrode, the source electrode, and the drain electrode are formed of a metallic material.

* * * * *